(12) United States Patent
Sun et al.

(10) Patent No.: US 7,098,495 B2
(45) Date of Patent: Aug. 29, 2006

(54) MAGNETIC TUNNEL JUNCTION ELEMENT STRUCTURES AND METHODS FOR FABRICATING THE SAME

(75) Inventors: JiJun Sun, Chandler, AZ (US); Renu W. Dave, Chandler, AZ (US); Jon M. Slaughter, Tempe, AZ (US); Johan Akerman, Gilbert, AZ (US)

(73) Assignee: Freescale Semiconducor, Inc., Austin, TX (US)

( * ) Notice: Subject to any disclaimer, the term of this patent is extended or adjusted under 35 U.S.C. 154(b) by 85 days.

(21) Appl. No.: 10/899,610

(22) Filed: Jul. 26, 2004

(65) Prior Publication Data

US 2006/0017081 A1    Jan. 26, 2006

(51) Int. Cl.
*H01L 29/76* (2006.01)

(52) U.S. Cl. .................. 257/295; 257/421; 257/489; 365/158

(58) Field of Classification Search ........... 257/295, 257/421, 489
See application file for complete search history.

(56) References Cited

U.S. PATENT DOCUMENTS

| | | | |
|---|---|---|---|
| 5,909,345 A | 6/1999 | Kawawake et al. | |
| 6,031,692 A | 2/2000 | Kawawake et al. | |
| 6,181,537 B1 | 1/2001 | Gill | |
| 6,198,610 B1 | 3/2001 | Kawawake et al. | |
| 6,205,052 B1 | 3/2001 | Slaughter et al. | |
| 6,340,533 B1 | 1/2002 | Ueno et al. | |
| 6,449,133 B1 | 9/2002 | Makino et al. | |
| 6,545,906 B1 | 4/2003 | Savtchenko et al. | |
| 6,608,738 B1 | 8/2003 | Sakakima et al. | |
| 6,831,312 B1* | 12/2004 | Slaughter et al. | ........... 257/295 |
| 2003/0021808 A1 | 1/2003 | Nickel et al. | |
| 2004/0041183 A1 | 3/2004 | Slaughter et al. | |
| 2004/0042128 A1 | 3/2004 | Slaughter et al. | |

OTHER PUBLICATIONS

Mizuguchi et al.; "Characteristics of Spin-Valve Films with Non-Magnetic Oxide Layers for Specular-Scattering"; IEEE Transactions on Magnetics, Jul. 2001, p. 1742-1744, vol. 37, No. 4.

* cited by examiner

*Primary Examiner*—Mai-Huong Tran
(74) *Attorney, Agent, or Firm*—Ingrassia, Fisher &Lorenze

(57) ABSTRACT

Magnetic tunnel junction ("MTJ") element structures and methods for fabricating MTJ element structures are provided. An MTJ element structure may comprise a crystalline pinned layer, an amorphous fixed layer, and a coupling layer disposed between the crystalline pinned layer and the amorphous fixed layer. The amorphous fixed layer is antiferromagnetically coupled to the crystalline pinned layer. The MTJ element further comprises a free layer and a tunnel barrier layer disposed between the amorphous fixed layer and the free layer.

Another MTJ element structure may comprise a pinned layer, a fixed layer and a non-magnetic coupling layer disposed therebetween. A tunnel barrier layer is disposed between the fixed layer and a free layer. An interface layer is disposed adjacent the tunnel barrier layer and a layer of amorphous material. The first interface layer comprises a material having a spin polarization that is higher than that of the amorphous material.

27 Claims, 2 Drawing Sheets

MAGNETIC TUNNEL JUNCTION ELEMENT STRUCTURES AND METHODS FOR FABRICATING THE SAME

FIELD OF THE INVENTION

The present invention relates generally to magnetoelectronic devices, and more particularly relates to magnetic tunnel junction element structures and methods for fabricating magnetic tunnel junction element structures.

BACKGROUND OF THE INVENTION

Magnetoelectronics devices, spin electronics devices, and spintronics devices are synonymous terms for devices that use the effects predominantly caused by electron spin. Magnetoelectronics effects are used in numerous information devices, and provide non-volatile, reliable, radiation resistant, and high-density data storage and retrieval. The numerous magnetoelectronics information devices include, but are not limited to, magnetic random access memory (MRAM), magnetic sensors, and read/write heads for disk drives.

Typically, a magnetoelectronic device, such as a magnetic memory element, has a structure that includes multiple ferromagnetic layers separated by at least one non-magnetic layer. In the magnetic memory element, information is stored as directions of magnetization vectors in the magnetic layers. Magnetization vectors in one magnetic layer, for instance, are magnetically fixed or pinned, while the magnetization direction of the other magnetic layer is free to switch between the same and opposite directions that are called "parallel" and "antiparallel" states, respectively. In response to parallel and antiparallel states, the magnetic memory element represents two different resistances. The resistance has minimum and maximum values when the magnetization vectors of the two magnetic layers point in substantially the same and opposite directions, respectively. Accordingly, a detection of change in resistance allows a device, such as an MRAM device, to provide information stored in the magnetic memory element. The difference between the minimum and maximum resistance values divided by the minimum resistance is known as the magnetoresistance ratio (MR).

One type of magnetic memory element, a magnetic tunnel junction (MTJ) element, comprises a fixed ferromagnetic layer that has a magnetization direction fixed with respect to an external magnetic field and a free ferromagnetic layer that has a magnetization direction that is free to rotate with the external magnetic field. The fixed layer and free layer are separated by an insulating tunnel barrier layer that relies upon the phenomenon of spin-polarized electron tunneling through the tunnel barrier layer between the free and fixed ferromagnetic layers. The tunneling phenomenon is electron spin dependent, making the magnetic response of the MTJ element a function of the relative orientations and spin polarization of the conduction electrons between the free and fixed ferromagnetic layer.

The tunnel barrier layer is important to the performance of the MTJ element, as the MR is strongly dependent on the tunnel barrier quality. In particular, the surface smoothness of the tunnel barrier plays a critical role in making a high-quality MTJ device. Typically, surface roughness of the tunnel barrier leads to a reduction of MR due to non-tunnel current flow through the barrier or over oxidation of high spots in the bottom ferromagnetic layer, which consequently reduces reliability and thus process yield in MTJ device fabrication. Further, because future generations of magnetoelectronic devices, such as MRAMs, will be scaled to smaller sizes, thinner tunnel barrier layers will be required. Accordingly, as the tunnel barrier layers become thinner in future devices, the surface smoothness will become even more important.

Accordingly, it is desirable to provide MTJ elements having tunnel barrier layers with reduced surface roughness. In addition, it is desirable to provide a process for fabricating an MTJ element having improved electrical properties. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
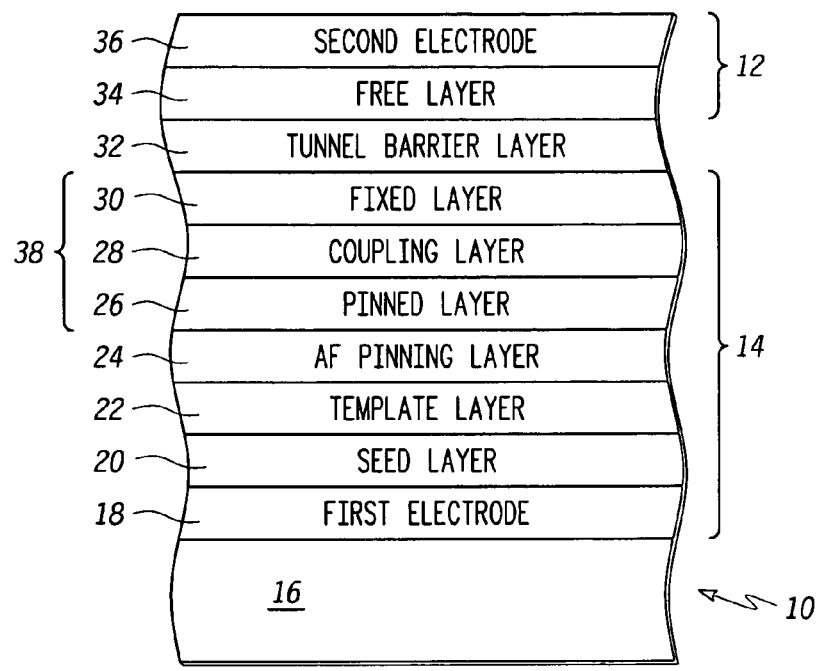
FIG. 1 is a cross-sectional view of a magnetic tunnel junction element structure in accordance with one exemplary embodiment of the present invention.

Referring to FIG. 1, an MTJ element 10 in accordance with one exemplary embodiment of the present invention comprises a substrate 16, a first electrode multilayer stack 14, a second electrode multilayer stack 12, and an insulating tunnel barrier layer 32 disposed between the first electrode multilayer stack 14 and the second electrode multilayer stack 12. Substrate 16 may comprise any suitable insulating material, such as, for example, a dielectric material. First electrode multilayer stack 14 and second electrode multilayer stack 12 include ferromagnetic layers, as described in more detail below. Tunnel barrier layer 32 preferably is formed of a dielectric material and more preferably is formed of an aluminum oxide (AlOx). Tunnel barrier layer 32 may have any suitable thickness, but preferably has a thickness in the range of from about 7 to about 15 angstroms. The layers of first multilayer stack 14, second multilayer stack 12, and tunnel barrier layer 32 may be formed by any suitable deposition process, such as, for example, ion beam deposition, physical vapor deposition (PVD), molecular beam epitaxy (MBE), and the like.

First electrode multilayer stack 14 comprises a first, or base, electrode layer 18, which is formed on substrate 16. First electrode layer 18 may be composed of a single conductive material or layer or, alternatively, first electrode layer 18 may be a multi-layer stack of more than one conductive material or layer. In either case, first electrode layer 18 provides electrical contact to the layers of first electrode multilayer stack 14.

In one embodiment of the present invention, first electrode multilayer stack 14 includes a seed layer 20 deposited overlying first electrode layer 18. Seed layer 20 may be formed of any suitable material suitable for seeding the subsequent formation of an antiferromagnetic AF pinning layer 24, described in more detail below. Examples of materials suitable for forming seed layer 20 include, for example, tantalum (Ta) or a tantalum nitride (TaNx) that is fabricated by reactive sputtering or by plasma or ion beam nitridation of a relatively thin, preferably less than about 100 angstroms and most preferably less than about 50 angstroms, layer of tantalum. Seed layer 20 may be a layer separate from first electrode layer 18 or may comprise the same layer as first electrode layer 18. First electrode multilayer stack 14 may also comprise an optional template layer 22 overlying seed layer 20. Template layer 22 may comprise a nickel iron (NiFe) alloy, a nickel iron cobalt (NiFeCo) alloy, ruthenium (Ru), tantalum (Ta), aluminum (Al), or any other material suitable for facilitating growth of an antiferromagnetic pinning layer 24. Antiferromagnetic pinning layer 24 is disposed overlying the seed layer 20 and/or the template layer 22. The antiferromagnetic pinning layer 24 may be formed from any suitable antiferromagnetic material, but preferably comprises a manganese alloy, with the general composition MnX, where X is preferably one or more materials selected from a group of platinum (Pt), palladium (Pd), nickel (Ni), iridium (Ir), osmium (Os), ruthenium (Ru), or iron (Fe).

A pinned ferromagnetic layer 26 is formed on and exchange coupled with the underlying antiferromagnetic pinning layer 24, which pins the magnetic moment of the pinned ferromagnetic layer 26 in one direction. The pinned ferromagnetic layer 26 is crystalline in structure and may be formed of, for example, a cobalt iron alloy, such as CoFe or CoFeX, where X may comprise boron (B), tantalum (Ta), hafnium (Hf), or carbon (C). An amorphous fixed ferromagnetic layer 30 is formed on a metallic coupling layer 28, which overlies pinned ferromagnetic layer 26. As used herein, the term "amorphous" shall mean a material or materials in which there is no long-range crystalline order such as that which would give rise to a readily discernable peak using normal x-ray diffraction measurements or a discernable pattern image using electron diffraction measurements. In one embodiment of the invention, amorphous fixed ferromagnetic layer 30 may be formed of an alloy of cobalt (Co), iron (Fe), and boron (B). For example, the amorphous fixed layer 30 may be formed of an alloy comprising 71.2% at. cobalt, 8.8% at. iron, and 20% at. boron. This composition is a CoFe alloy with boron added to it and can be represented as $(Co_{89}Fe_{11})_{80}B_{20}$. However, it will be appreciated that any other suitable alloy composition, such as CoFeX (where X may be one or more of tantalum, hafnium, boron, carbon, and the like), or alloys comprising cobalt and/or iron, may be used to form amorphous fixed layer 30. Metallic coupling layer 28 may be formed of any suitable material that serves to antiferromagnetically couple crystalline pinned layer 26 and amorphous fixed layer 30, such as ruthenium, rhenium, osmium, rhodium, or alloys thereof, but is preferably formed of ruthenium. Metallic coupling layer 28, crystalline pinned layer 26, and amorphous fixed layer 30 create a synthetic antiferromagnet (SAF) structure 38. The antiferromagnetic coupling of the SAF structure provided through metallic coupling layer 28 makes MTJ element 10 more stable in applied magnetic fields. Additionally, by varying the thickness of ferromagnetic layers 26 and 30, magnetostatic coupling to the free layer can be offset and the hysteresis loop can be centered.

Due to the nature of amorphous structures, that is, that amorphous structures have no substantial crystalline grain boundaries, the amorphous fixed layer 30 of the SAF structure 38 facilitates the growth of a tunnel barrier layer 32 having smoother surfaces than if the tunnel barrier layer 32 were grown over a crystalline or polycrystalline fixed layer. The smoother surfaces of the tunnel barrier layer improve the magnetoresistance of MTJ element 10. In addition, the crystalline pinned layer 26 of the SAF structure 38 results in sufficient antiferromagnetic coupling strength so that the SAF structure is stable in an external magnetic field. Accordingly, the amorphous fixed layer and the crystalline pinned layer serve to improve performance, reliability, and manufacturability of MJT element 10.

Second electrode multilayer stack 12 comprises a free ferromagnetic layer 34 and a protective second electrode layer 36. Second electrode layer 36 may be formed of any suitable conductive material, such as tantalum. In a preferred embodiment of the invention, second electrode layer 36 may comprise more than one layer of material, such as, for example, a layer of tantalum nitride overlying a layer of tantalum. The magnetic moment of free ferromagnetic layer 34 is not substantially fixed or pinned by exchange coupling and is substantially free to rotate in the presence of an applied magnetic field. The free layer 34 may have an amorphous or crystalline structure and may be formed of any suitable alloy composition, such as CoFeX (where X may be boron, tantalum, hafnium, carbon, and the like), or alloys comprising nickel and iron, or alloys comprising cobalt, nickel, and iron. The free layer 34 may comprise one layer of material or may comprise multiple layers. For example, in one embodiment of the invention, free layer 34 may comprise a single layer of NiFeCo. In another embodiment of the invention, free layer 34 may be an SAF structure comprising, for example, two layers of ferromagnetic material, such as NiFe, separated by a coupling layer of conducting material such as ruthenium, rhenium, osmium, rhodium, alloys thereof, and the like.

It will be appreciated that, while FIG. 1 and the above accompanying description discloses an MTJ element 10 with a crystalline pinned layer overlying an AF pinning layer, a metallic coupling layer overlying the crystalline pinned layer, an amorphous fixed layer overlying the coupling layer, a tunnel barrier layer overlying the fixed layer, and a free layer or free SAF structure overlying the tunnel barrier layer, the invention is not so limited. Rather, the present invention may also be used for MTJ elements that have the reverse or flipped structure, with a tunnel barrier layer overlying a free layer or free SAF structure, an amorphous fixed layer overlying the tunnel barrier layer, a coupling layer overlying the amorphous fixed layer, a crystalline pinned layer overlying the metallic coupling layer, and an AF pinning layer overlying the pinned layer.

Figure 2:
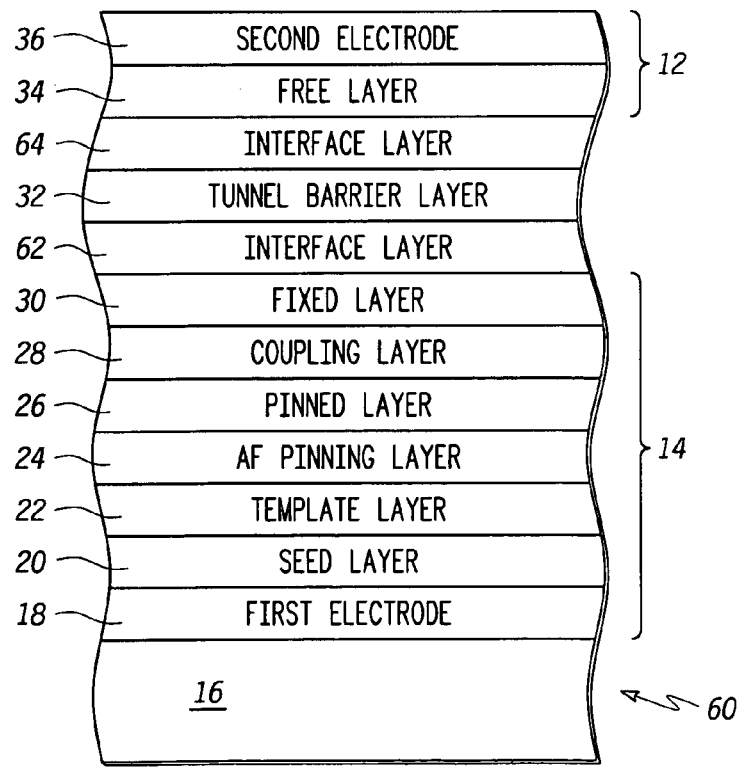
FIG. 2 is a cross-sectional view of a magnetic tunnel junction element structure in accordance with another exemplary embodiment of the present invention.

FIG. 2 illustrates an MTJ element 60 in accordance with another embodiment of the present invention. MTJ element 60 is similar to MTJ element 10 of FIG. 1, wherein like reference numerals designate like or similar layers. MTJ element 60 comprises substrate 16, first electrode multilayer stack 14, second electrode multilayer stack 12, and insulating tunnel barrier layer 32 disposed between the first electrode multilayer stack 14 and the second electrode multilayer stack 12. As described above for MTJ element 10 with reference to FIG. 1, first electrode stack 14 may comprise a first electrode 18, a seed layer 20, a template layer 22, an antiferromagnetic pinning layer 24, a crystalline ferromagnetic pinned layer 26, a coupling layer 28, and an amorphous ferromagnetic fixed layer 30. Likewise, second electrode multilayer stack 12 of MTJ element 60 may comprise a second electrode 36 and a free layer 34, which may comprise one ferromagnetic layer or may comprise multiple layers such as an SAF structure.

In one embodiment of the present invention, MTJ element 60 further comprises an interface layer 62, which is formed between amorphous fixed layer 30 and tunnel barrier layer 32. In another embodiment of the present invention, when the free layer 34 is one layer or multiple layers of amorphous material, MTJ element may comprise an interface layer 64, which is formed between tunnel barrier layer 32 and the amorphous free layer 34. In yet another embodiment of the present invention, MTJ element 60 may comprise both interface layer 62 and interface layer 64. Because the magnetoresistance of MTJ element 60 is proportional to the product of the spin polarizations of the ferromagnetic layers adjacent either surface of tunnel barrier layer 32, interface layer 62 and/or interface layer 64 may be used to enhance the magnetoresistance of MTJ element 60. Accordingly, interface layers 62 and 64 may be amorphous, crystalline or polycrystalline and may be formed of a "high spin polarization material." As used herein, the term "high spin polarization material" means a material having a spin polarization that is higher than the spin polarization of the amorphous ferromagnetic material to which it is adjacent. Thus, interface layer 62 may be formed of a material having a spin polarization that is higher than the spin polarization of amorphous fixed layer 30. Likewise, interface layer 64 may be formed of a material having a spin polarization that is higher than the spin polarization of amorphous free layer 34. For example, in one embodiment of the invention, amorphous fixed layer 30 may comprise CoFeB and interface layer 62 may comprise CoFe. Similarly, amorphous free layer 34 may comprise CoFeB and interface layer 64 may comprise CoFe. However, it will be appreciated that interface layers 62 and 64 also may comprise CoFeX, where X may comprise boron, tantalum, hafnium, carbon, and the like, and X is less than 5% at. Alternatively, interface layers 62 and 64 may comprise other cobalt-containing alloys or other iron-containing alloys. Use of interface layer 62 or interface layer 64 or both may depend on various factors such as, for example, the desired magnetic properties of the MTJ element, the desired electrical properties of the MTJ element, the intended application of the MTJ element, and the like.

Interface layers 62 and 64 are sufficiently thin that they do not counteract the improvement in MTJ device performance due to the amorphous nature of fixed layer 30 and/or free layer 34. In one embodiment of the invention, interface layers 62 and 64 have a thickness that is no greater than 15 angstroms. Preferably, interface layers 62 and 64 have a thickness no greater than 10 angstroms and, more preferably, have a thickness no greater than 5 angstroms. Further, while the amorphous nature of fixed layer 30 and/or free layer 34 may improve the electrical properties of MTJ element 60, such as the magnitude of magnetoresistance, stability of magnetoresistance, the antiferromagnetic coupling strength (determined by saturation field ($H_{sat}$)), and the like, the presence of interface layer 62 and/or interface layer 64 in MJT element 60 may also improve the electrical properties by increasing the magnetoresistance of the MJT element.

Figure 3:
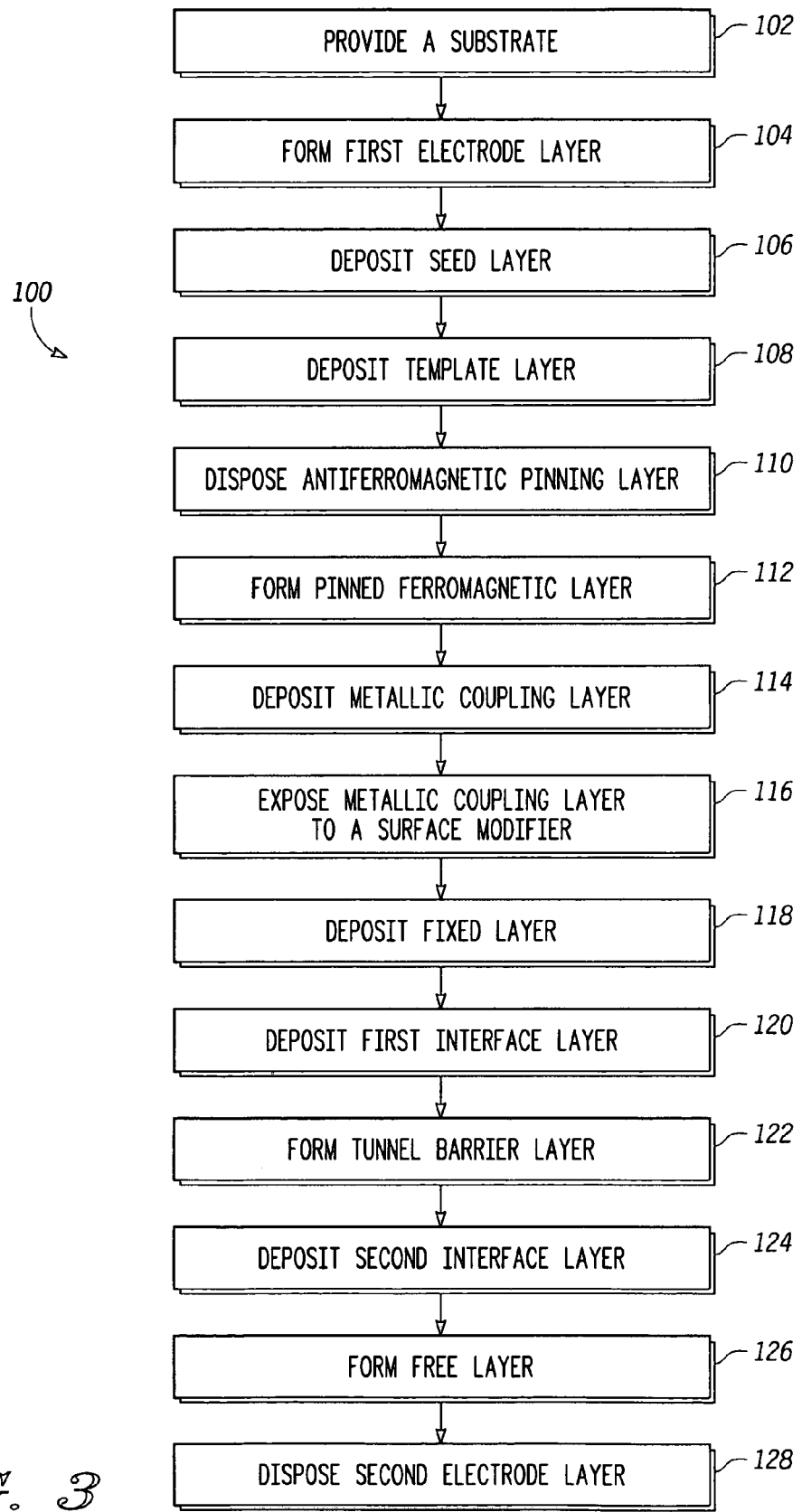
FIG. 3 is a flow chart of a process in accordance with an exemplary embodiment of the present invention for making a magnetic tunnel junction element structure such as that of FIG. 1 or 2.

FIG. 3 is a flowchart of a process 100, in accordance with an exemplary embodiment of the present invention for fabricating a semiconductor structure such as the structures illustrated in FIGS. 1 and 2. The process 100 may begin by providing a substrate, such as substrate 16 of FIGS. 1 and 2 (step 102) and forming first electrode layer 18 overlying substrate 16 (step 104). As described above, first electrode layer 18 may comprise one or more layers of metal or other conductive material that provides electrical contact to layers formed subsequently. Seed layer 20 may be deposited overlying first electrode layer 18 (step 106). Seed layer 20 may be a layer separate from first electrode layer 18 or, alternatively, seed layer 20 may comprise the same layer or layers as first electrode layer 18. An optional template layer 22 then may be fabricated overlying seed layer 20 and/or first electrode layer 18 (step 108).

Process 100 further comprises disposing an antiferromagnetic pinning layer 24 overlying optional template layer 22 and/or seed layer 20 and/or first electrode layer 18 (step 110) and forming a crystalline pinned ferromagnetic layer 26 on antiferromagnetic pinning layer 24 so that pinned ferromagnetic layer 26 is exchange coupled with antiferromagnetic pinning layer 24 (step 112). A metallic coupling layer 28 then is deposited overlying pinned ferromagnetic layer 26 (step 114). As described above, metallic coupling layer 28 may be formed of any suitable thickness and of any suitable material that serves to antiferromagnetically couple crystalline pinned layer 26 with an overlying amorphous fixed layer 30. Materials suitable for forming metallic coupling layer 28 may include ruthenium, osmium, rhodium, rhenium, and the like, and alloys thereof. Preferably, metallic coupling layer 28 is formed of ruthenium.

In accordance with one embodiment of the invention, metallic coupling layer 28 then is exposed to a surface modifier that modifies the exposed surface of metallic coupling layer 28 (step 116). As used herein, the term "surface modifier" means any suitable material that modifies the surface of metallic coupling layer 28 so that a subsequently formed fixed layer 30 overlying metallic coupling layer 28 exhibits a smoother surface upon which a tunnel barrier layer may be formed than would be exhibited if the metallic coupling layer were not so modified. Thus, the surface modifier results in an increase in MR of the MJT element. The surface modifier also may result in improved breakdown voltage and fewer tunneling hot spots in MJT elements, thus increasing yield and narrowing bit resistance distribution of MJT element arrays.

In one embodiment of the invention, the surface modifier comprises oxygen. In this regard, metallic coupling layer 28 may be exposed to an oxygen environment having a dose (pressure multiplied by exposure time) of from about $10^{-5}$ Torr-s to about $10^{-1}$ Torr-s at room temperature. Metallic coupling layer 28 is exposed to the oxygen environment for a time that is sufficiently long to permit the oxygen to modify the exposed surface of metallic coupling layer 28 but for a time that is sufficiently short that the antiferromagnetic coupling provided by the metallic coupling layer 28 is not substantially reduced. In one embodiment of the invention, metallic coupling layer is exposed to an oxygen environment for a time that is sufficiently short that oxygen is not permitted to deposit to a thickness that is discernable by standard measurement techniques. In preferred embodiment of the invention, metallic coupling layer 28 is exposed to an oxygen environment for a time period that permits no more than two monolayers of oxygen to be deposited on the exposed surface of metallic coupling layer 28. It will be appreciated that the surface modifier may comprise materials other than or in addition to oxygen, such as, for example, air, an argon (Ar)/oxygen ($O_2$) mixture, or a nitrogen ($N_2$)/oxygen ($O_2$) mixture.

After modification of the exposed surface of metallic coupling layer 28, a fixed ferromagnetic layer may be deposited overlying metallic coupling layer 28 (step 118). In one embodiment of the invention, the fixed ferromagnetic layer may be formed of a crystalline ferromagnetic material, such as, for example, CoFe or any other suitable cobalt alloy and/or iron alloy. In another, more preferred, embodiment of the invention, the fixed ferromagnetic layer may be amorphous, such as amorphous fixed layer 30 described above with reference to FIGS. 1 and 2. In this regard, the amorphous fixed layer may be formed of an amorphous ferromagnetic alloy such, as CoFeX, where X may be boron, carbon, tantalum, hafnium, and the like, or may be formed of other alloys of cobalt and/or iron.

In another embodiment of the invention, when the fixed layer comprises an amorphous material, process 100 further may comprise depositing a first interface layer, such as interface layer 62 of FIG. 2, overlying the fixed layer (step 120). Interface layer 62 may be formed of a material having a spin polarization that is higher than the spin polarization of the amorphous fixed layer 30. For example, the fixed layer may comprise an amorphous layer of CoFeB and the first interface layer may comprise CoFe. However, in another embodiment of the invention, the first interface layer may comprise CoFeX, where X may comprise boron, tantalum, carbon, hafnium and the like, and X is less than 5% at. In yet another embodiment of the invention, the first interface layer may comprise other cobalt-containing alloys or other iron-containing alloys.

An insulating tunnel barrier layer, such as tunnel barrier layer 32 of FIGS. 1 and 2, then may be formed overlying the first interface layer and/or the fixed layer (step 122). The tunnel barrier layer may be formed using any suitable insulating material known in the semiconductor industry for forming tunnel barrier layers. For example, the tunnel barrier layer may be formed by depositing a layer of aluminum overlying the first interface layer and/or the fixed layer and oxidizing the aluminum layer, as is well known in the art.

A free ferromagnetic layer, such as free ferromagnetic layer 34, then may be formed overlying the tunnel barrier layer (steps 126). As described above, the free layer may have an amorphous or crystalline structure and may be formed of any suitable alloy composition, such as CoFeX (where X may be boron, carbon, tantalum, hafnium, and the like), NiFe alloys or other alloys comprising cobalt, iron, and nickel. In another optional embodiment of the invention, the free layer may be an SAF structure comprising, for example, two layers of ferromagnetic material, such as NiFe, separated by a metallic coupling layer of insulating material such as ruthenium, rhenium, osmium, rhodium, and the like, and alloys thereof.

In yet another optional embodiment of the invention, when the free layer comprises an amorphous material, a second interface layer, such as interface layer 64, may be deposited overlying the tunnel barrier layer before forming the amorphous free ferromagnetic layer (step 124). The second interface layer may comprise a material having a spin polarization that is higher than the spin polarization of the free layer. For example, the free layer may comprise amorphous CoFeB and the second interface layer may comprise CoFe. However, in another embodiment of the invention, the second interface layer may comprise CoFeX, where X may comprise boron, tantalum, hafnium, carbon, and the like, and X is less than 5% at. In yet another embodiment of the invention, the second interface layer may comprise other cobalt-containing alloys and/or other iron-containing alloys.

After formation of the free layer, a second electrode layer, such as second electrode layer 36, may be disposed overlying the free layer (step 128). As described above, the second electrode layer may be formed of any suitable conductive material, such as tantalum. In a preferred embodiment of the invention, the second electrode layer may comprise more than one layer of material, such as, for example, a layer of tantalum nitride (TaNx) overlying a layer of tantalum.

The formation of the layers of process 100 described above with reference to FIG. 3 may be performed using any suitable conventional deposition method(s) known in the semiconductor industry, such as, for example, ion beam deposition, physical vapor deposition (PVD), molecular beam epitaxy (MBE), and the like. Further, it will be appreciated that processes of the present invention are not limited to the order of the steps as described above with reference to FIG. 3. Rather, the steps may be performed in reverse order to fabricate a magnetic tunnel junction element having a tunnel barrier layer overlying a free layer or free layer SAF structure, a fixed layer overlying the tunnel barrier layer, and a pinned layer overlying the fixed layer. In this regard, when the free layer is an SAF structure as described above, after formation of the second electrode, a first ferromagnetic layer of the free SAF structure may deposited, followed by the deposition of a metallic coupling layer. The metallic coupling layer then may be exposed to a surface modifier that modifies the exposed surface of the metallic coupling layer. The surface modifier modifies the surface of the metallic coupling layer so that a subsequently formed second ferromagnetic layer overlying the metallic coupling layer exhibits a smoother surface upon which a tunnel barrier layer may be formed than would be exhibited if the metallic coupling layer were not so modified. After modification of the surface of the metallic coupling layer, a second ferromagnetic layer of the free SAF layer may be deposited overlying the metallic coupling layer. The process then could proceed with formation of a tunnel barrier layer and a fixed SAF structure. It will be appreciated that, in another embodiment of the invention, both the metallic coupling layer of the fixed SAF structure and the metallic coupling layer of the free SAF structure could be exposed to a surface modifier before subsequent deposition of an overlying layer to improve the physical quality of the overlying layer.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A magnetic tunnel junction element comprising:
 a synthetic antiferromagnet pinned structure comprising:
  a crystalline pinned ferromagnetic layer;
  an amorphous fixed ferromagnetic layer; and
  a non-magnetic coupling layer disposed between the crystalline pinned ferromagnetic layer and the amorphous fixed ferromagnetic layer, wherein the amorphous fixed ferromagnetic layer is antiferromagnetically coupled to the crystalline pinned ferromagnetic layer;

a first electrode stack comprising a free ferromagnetic layer, and a tunnel barrier layer disposed between the synthetic antiferromagnet pinned structure and the first electrode stack.

2. The magnetic tunnel junction element of claim 1, further comprising an antiferromagnetic pinning layer disposed proximate to the crystalline pinned ferromagnetic layer, wherein the crystalline pinned ferromagnetic layer is exchange coupled with the antiferromagnetic pinning layer.

3. The magnetic tunnel junction element of claim 1, the amorphous fixed ferromagnetic layer comprising a material having the formula CoFeX, wherein X comprises at least one material selected from the group consisting of boron, tantalum, carbon, and hafnium.

4. The magnetic tunnel junction element of claim 1, the free ferromagnetic layer comprising an amorphous material.

5. The magnetic tunnel junction element of claim 1, the free ferromagnetic layer comprising a crystalline material.

6. The magnetic tunnel junction element of claim 1, the free ferromagnetic layer comprising an SAF structure having two ferromagnetic layers and a non-magnetic layer disposed between the two ferromagnetic layers.

7. The magnetic tunnel junction element of claim 1, the first electrode stack further comprising an electrode layer disposed proximate to the free ferromagnetic layer.

8. The magnetic tunnel junction element of claim 1, the crystalline pinned ferromagnetic layer comprising an alloy of cobalt and iron or an alloy of nickel, cobalt and iron.

9. The magnetic tunnel junction element of claim 8, the crystalline pinned ferromagnetic layer comprising a material having the formula CoFeX, wherein X comprises at least one material selected from the group consisting of boron, tantalum, hafnium, and carbon.

10. The magnetic tunnel junction element of claim 1, the non-magnetic coupling layer comprising a material selected from the group consisting of ruthenium, rhenium, osmium, rhodium, and any combination thereof.

11. A magnetic tunnel junction element comprising:
a synthetic antiferromagnet pinned structure comprising:
a pinned ferromagnetic layer;
a fixed ferromagnetic layer; and
a non-magnetic coupling layer disposed between the pinned ferromagnetic layer and the fixed ferromagnetic layer, wherein the fixed ferromagnetic layer is antiferromagnetically coupled to the pinned ferromagnetic layer;
an electrode stack comprising a free ferromagnetic layer;
a tunnel barrier layer disposed between the synthetic antiferromagnet pinned structure and the first electrode stack; and
a first interface layer disposed adjacent the tunnel barrier layer and a layer of amorphous material,
wherein the first interface layer comprises a material having a spin polarization that is higher than the spin polarization of the layer of amorphous material.

12. The magnetic tunnel junction element of claim 11, the first interface layer having a thickness no greater than about 15 angstroms.

13. The magnetic tunnel junction element of claim 11, the first interface layer having a thickness no greater than about 5 angstroms.

14. The magnetic tunnel junction element of claim 11, the layer of amorphous material comprising a material having the formula CoFeX, wherein X comprises at least one material selected from the group consisting of boron, tantalum, hafnium, and carbon, and the first interface layer comprising CoFe.

15. The magnetic tunnel junction element of claim 11, the fixed ferromagnetic layer comprising the layer of amorphous material, wherein the first interface layer is disposed between the tunnel barrier layer and the fixed ferromagnetic layer and wherein the first interface layer comprises a material having a spin polarization that is higher than the spin polarization of the fixed ferromagnetic layer.

16. The magnetic tunnel junction element of claim 15, wherein the free ferromagnetic layer comprises an amorphous material and wherein the magnetic tunnel junction element further comprises a second interface layer disposed between the tunnel barrier layer and the free ferromagnetic layer, the second interface layer comprising a material having a spin polarization that is higher than the spin polarization of the free ferromagnetic layer.

17. The magnetic tunnel junction element of claim 16, wherein the free ferromagnetic layer comprises an SAF structure having two ferromagnetic material layers separated by a non-magnetic coupling layer.

18. The magnetic tunnel junction element of claim 11, the free ferromagnetic layer comprising the layer of amorphous material, wherein the first interface layer is disposed between the tunnel barrier layer and the free ferromagnetic layer and wherein the first interface layer comprises a material having a spin polarization that is higher than the spin polarization of the free ferromagnetic layer.

19. The magnetic tunnel junction element of claim 18, wherein the free ferromagnetic layer comprises an SAF structure having two ferromagnetic material layers separated by a non-magnetic coupling layer.

20. A magnetic tunnel junction element comprising:
a crystalline pinned ferromagnetic layer;
an amorphous fixed ferromagnetic layer; and
a first non-magnetic coupling layer disposed between the crystalline pinned ferromagnetic layer and the amorphous fixed ferromagnetic layer, wherein the amorphous fixed ferromagnetic layer is antiferromagnetically coupled to the crystalline pinned ferromagnetic layer, and wherein the first non-magnetic coupling layer comprises a modified surface;
a free ferromagnetic layer,
a tunnel barrier layer disposed between the amorphous fixed layer and the free ferromagnetic layer; and
a first interface layer disposed between the tunnel barrier layer and a layer of amorphous material;
wherein the first interface layer comprises a material having a spin polarization that is higher than the spin polarization of the layer of amorphous material.

21. The magnetic tunnel junction element of claim 20, the amorphous fixed ferromagnetic layer comprising a material having the formula CoFeX, wherein X comprises a material selected from the group consisting of boron, tantalum, carbon, hafnium, and combinations thereof.

22. The magnetic tunnel junction element of claim 20, wherein the first non-magnetic coupling layer has an oxygen-modified surface.

23. The magnetic tunnel junction element of claim 20, wherein the free ferromagnetic layer comprises an SAF structure having two ferromagnetic layers separated by a second non-magnetic coupling layer having a modified surface.

24. The magnetic tunnel junction element of claim 23, wherein the second non-magnetic coupling layer has an oxygen-modified surface.

25. The magnetic tunnel junction element of claim 20, wherein the layer of amorphous material comprises the amorphous fixed ferromagnetic layer and the first interface layer is disposed between the amorphous fixed ferromagnetic layer and the tunnel barrier layer.

26. The magnetic tunnel junction element of claim 25, wherein the free ferromagnetic layer is formed of an amorphous material and the magnetic tunnel junction element further comprises a second interface layer disposed between the tunnel barrier layer and the free ferromagnetic layer.

27. The magnetic tunnel junction element of claim 20, wherein layer of amorphous material comprises the free ferromagnetic layer and the first interface layer is disposed between the tunnel barrier layer and the amorphous free ferromagnetic layer.

* * * * *